United States Patent
Adderly et al.

(10) Patent No.: US 9,006,703 B2
(45) Date of Patent: Apr. 14, 2015

(54) METHOD FOR REDUCING LATERAL EXTRUSION FORMED IN SEMICONDUCTOR STRUCTURES AND SEMICONDUCTOR STRUCTURES FORMED THEREOF

(71) Applicant: International Business Machines Corporation, Armonk, NY (US)

(72) Inventors: Shawn A. Adderly, Essex Junction, VT (US); Brian M. Czabaj, Essex Junction, VT (US); Daniel A. Delibac, Colchester, VT (US); Jeffrey P. Gambino, Westford, VT (US); Matthew D. Moon, Jeffersonville, VT (US); David C. Thomas, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/955,531

(22) Filed: Jul. 31, 2013

(65) Prior Publication Data
US 2015/0035117 A1      Feb. 5, 2015

(51) Int. Cl.
| H01L 21/00 | (2006.01) |
| H01L 49/02 | (2006.01) |
| H01L 21/66 | (2006.01) |

(52) U.S. Cl.
CPC ............... *H01L 28/40* (2013.01); *H01L 22/12* (2013.01)

(58) Field of Classification Search
None
See application file for complete search history.

(56) References Cited

U.S. PATENT DOCUMENTS

| 6,455,906 B2 | 9/2002 | Chen et al. |
| 6,592,777 B2 | 7/2003 | Chen et al. |
| 7,157,381 B2 | 1/2007 | Efferenn et al. |
| 7,351,663 B1 | 4/2008 | Kabansky et al. |
| 2003/0203607 A1 | 10/2003 | Chen et al. |
| 2004/0124530 A1 | 7/2004 | Chen et al. |

FOREIGN PATENT DOCUMENTS

| EP | 2224469 A2 | 1/2010 |
| JP | 05-055385 | 3/1993 |
| JP | 07-153745 | 6/1995 |
| KR | 20120038293 A | 4/2012 |

*Primary Examiner* — David Vu
*Assistant Examiner* — Cuong B Nguyen
(74) *Attorney, Agent, or Firm* — David Cain; Hoffman Warnick LLC (57) ABSTRACT

Aspects of the present invention relate to method for reducing lateral extrusion formed in semiconductor structures and semiconductor structures formed thereof. Various embodiments include a method for reducing lateral extrusion formed in semiconductor structures. The method can include removing a portion of a first lateral extrusion in an aluminum layer of the semiconductor structure, and determining a post-removal thickness of a dielectric layer positioned adjacent the aluminum layer. The post-removal thickness may be determined subsequent to the removing of the portion of the first lateral extrusion. The method can also include determining a difference between the post-removal thickness of the dielectric layer and a pre-removal thickness of the dielectric layer.

12 Claims, 10 Drawing Sheets

METHOD FOR REDUCING LATERAL EXTRUSION FORMED IN SEMICONDUCTOR STRUCTURES AND SEMICONDUCTOR STRUCTURES FORMED THEREOF

BACKGROUND

1. Technical Field

The subject matter disclosed herein is related generally to semiconductor structures. More particularly, the subject matter disclosed herein relates to a method for reducing lateral extrusion formed in semiconductor structures and semiconductor structures formed thereof.

2. Related Art

The layers of material forming a semiconductor structure undergo a variety of physical changes during the formation of the semiconductor structure. For example, during a metal annealing process, the metal layers of the semiconductor structure may be exposed to high temperatures for an extended period of time, and may also experience a compression force from the layers of the semiconductor positioned above the metal layers. Due to the high temperature and/or compression force, some of the metal layers of the semiconductor structure may form extrusions during the metal annealing process. These extrusions may form on the sidewalls of the semiconductor structure, and may result in shorting of an active circuit area within the semiconductor structure.

Conventional semiconductor structures may include a slot or void in a metal layer surrounding the active circuit area to compensate for anticipated extrusions formed during the metal annealing process. However, dependent on the exposure to the high temperature during the metal annealing process, the metal layer may still form extrusions that short the active circuit area. That is, the slots or voids may not prevent shorting in the circuit, especially in the semiconductor structure which includes a small island circuit (e.g., metal-insulator-metal capacitor). The extrusions may be controlled by making the slots or voids larger. However, by making the slots or voids larger, the size of the active circuit becomes larger, which results in a larger semiconductor structure. Electronic devices utilizing a larger semiconductor structure may require new design of the circuitry and/or may require a larger overall size, which is undesirable.

BRIEF SUMMARY

A method for reducing lateral extrusion formed in semiconductor structures and semiconductor structures formed thereof is disclosed. Various embodiments include a method, including: removing a portion of a first lateral extrusion in an aluminum layer of a semiconductor structure; determining a post-removal thickness of a dielectric layer positioned adjacent the aluminum layer subsequent to the removing of the portion of the first lateral extrusion; and determining a difference between the post-removal thickness of the dielectric layer and a pre-removal thickness of the dielectric layer.

A first aspect of the invention includes a method including: removing a portion of a first lateral extrusion in an aluminum layer of a semiconductor structure; determining a post-removal thickness of a dielectric layer positioned adjacent the aluminum layer subsequent to the removing of the portion of the first lateral extrusion; and determining a difference between the post-removal thickness of the dielectric layer and a pre-removal thickness of the dielectric layer.

A second aspect of the invention includes a semiconductor structure. The semiconductor structure including: a metallurgy stack including an aluminum layer, the aluminum layer including an etched portion of a first lateral extrusion; a dielectric layer formed over the metallurgy stack; a metal-insulator-metal capacitor (MIM capacitor) structure positioned adjacent the metallurgy stack; and an opening extending through the metallurgy stack, the opening surrounding the MIM capacitor structure.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As described herein, aspects of the invention relate to a method for reducing lateral extrusion formed in semiconductor structures and semiconductor structures formed thereof. Specifically, as described herein, aspect of the invention are related to removing a portion of a lateral extrusion in an aluminum layer of a semiconductor structure. One method of removing a portion of a lateral extrusion in an aluminum layer of a semiconductor structure may now be described. Turning to FIGS. 1-4, one illustrative method according to various embodiments is shown.

Figure 1:
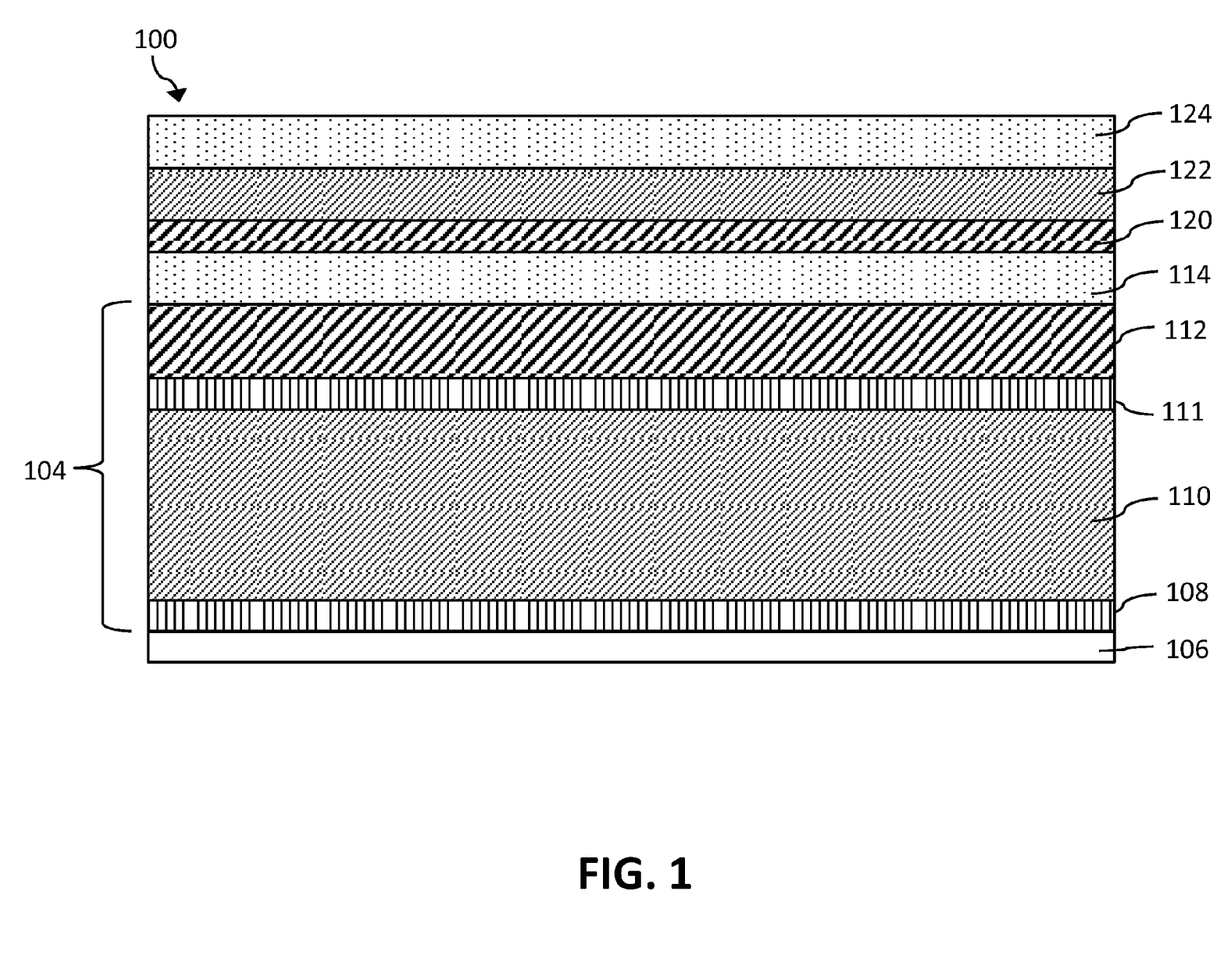
FIGS. 1-7 show cross-sectional front views and top views, respectively, of a semiconductor structure undergoing processes according to various embodiments of the invention.

FIG. 1 depicts a process according to various embodiments of the invention, the process including providing a semiconductor structure 100. That is, FIG. 1 shows a cross-section front view of a portion of semiconductor structure 100 according to embodiments of the invention. As shown in FIG. 1, and as discussed herein, semiconductor structure 100 may include a metal-insulator-metal capacitor structure (MIM capacitor) 102 (FIGS. 2 and 3) and specifically, the portion of semiconductor structure 100 may include a metallurgy stack 104 which may form portions of MIM capacitor 102. In an embodiment, as shown in FIG. 1, metallurgy stack 104 may be formed over oxide layer 106. More specifically, as shown in FIG. 1, metallurgy stack 104 may be formed by a process including, in order: forming a first titanium layer 108 over oxide layer 106, forming a first aluminum layer 110 over the first titanium layer 108, forming a second titanium layer 111 over first aluminum layer 110, forming a first titanium nitride layer 112 over the second titanium layer 111, and, forming a first dielectric layer 114 over first titanium nitride layer 112. As shown in FIG. 1, the layers of metallurgy stack 104 may be formed using any conventional deposition technique described herein and/or known in the art. For example, deposition techniques or the term "depositing" may include any now known or later developed techniques appropriate for the material to be deposited including but not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

First dielectric layer 114 as discussed herein may be formed from any conventional dielectric material including, but is not limited to: silicon carbide (SiC), silicon dioxide ($SiO_2$), silicon nitride ($Si_3N_4$), silicon-oxynitride (SiON), tantalum pentoxide ($Ta_2O_5$), aluminum oxide ($Al_2O_3$), barium titanate ($BaTiO_3$), hafnium oxide ($HfO_2$), zirconium dioxide ($ZrO_2$).

FIG. 1 may also depict another process according to various embodiments of the invention, the process including providing various layers used to form a portion (e.g., top plate) of MIM capacitor 102 (FIGS. 4 and 5) in semiconductor structure 100. More specifically, as shown in FIG. 1, the various layers forming a portion of MIM capacitor 102 may be formed above first dielectric layer 114 of semiconductor structure 100. As shown in FIG. 1, the various layers used to form a portion of MIM capacitor 102 (FIGS. 4 and 5) may be formed by a process including, in order: depositing a second layer of titanium nitride 120 over first dielectric layer 114 positioned above first titanium nitride layer 112, depositing a second aluminum layer 122 over second titanium nitride layer 120, and depositing an second dielectric layer 124 over second aluminum layer 122. As discussed herein, second dielectric layer 124 may act as an electrical insulator for the various layers (e.g., second titanium nitride layer 120, second aluminum layer 122) of MIM capacitor 102 (FIGS. 4 and 5) of semiconductor structure 100. As discussed herein, second dielectric layer 124 may include substantially similar dielectric material as first dielectric layer 114. The various layers (e.g., second titanium nitride layer 120, second aluminum layer 122) used to form a portion of MIM capacitor 102 (FIGS. 4 and 5) may be formed by any conventional deposition technique described herein and/or known in the art.

Figure 2:
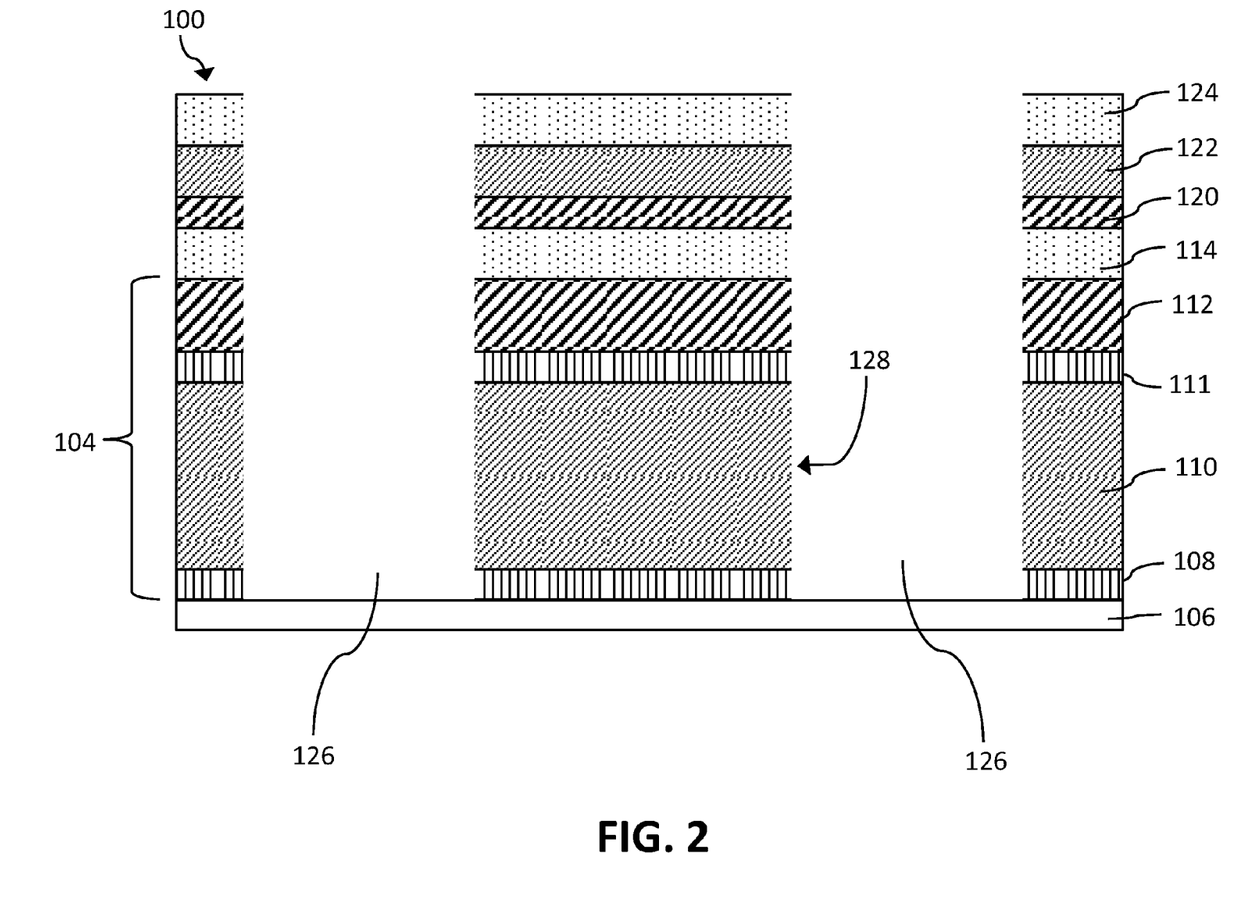
Figure 3:
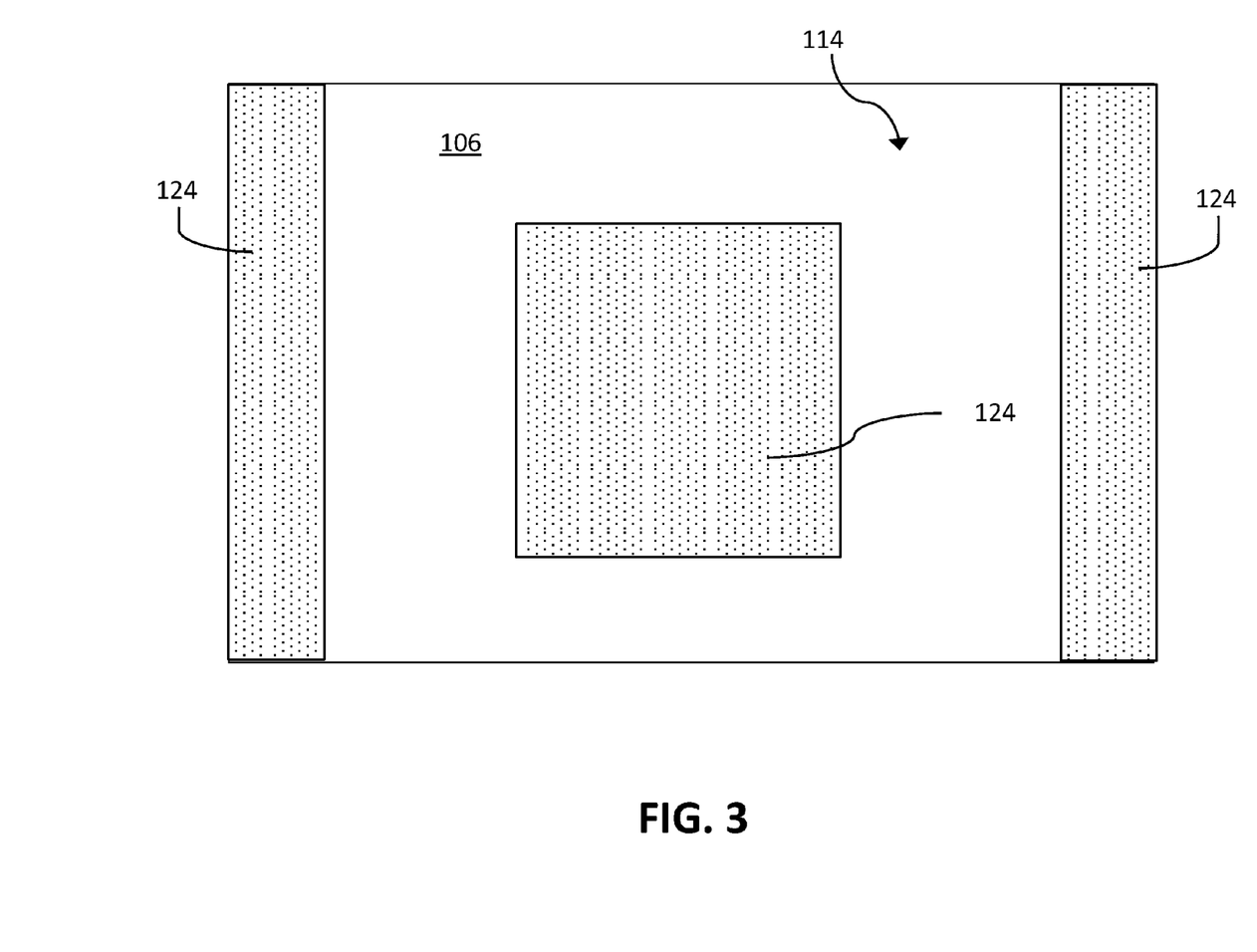

FIGS. 2 and 3 depicts another process according to various embodiments of the invention, the process including forming an opening 126 extending through metallurgy stack 104 including first aluminum layer 110. As shown in FIGS. 2 and 3, opening 126 may be substantially ring-shaped and may form and/or surrounds aluminum island 128 of semiconductor structure 100. More specifically, and as discussed herein, opening 126 may be formed around aluminum island 128 of semiconductor structure 100 to isolate or separate aluminum island 128 from the remainder of first aluminum layer 110 of semiconductor structure 100 (FIG. 2). That is, as shown in FIG. 2, first aluminum layer 110 of semiconductor structure 100 may include aluminum island 128 that may be substantially discontinuous from the rest of first aluminum layer 110. As discussed herein, aluminum island 128 may be used to form a bottom electrode of MIM capacitor 102 in semiconductor structure 100. Opening 126 may be formed by any now known or later developed material removal process discussed herein, including but not limited to: pattern and etching process, photolithographic masking and etching, etc. For example, opening 126 may be formed by performing a process including a patterning by lithography and reactive ion etching (RIE).

Figure 4:
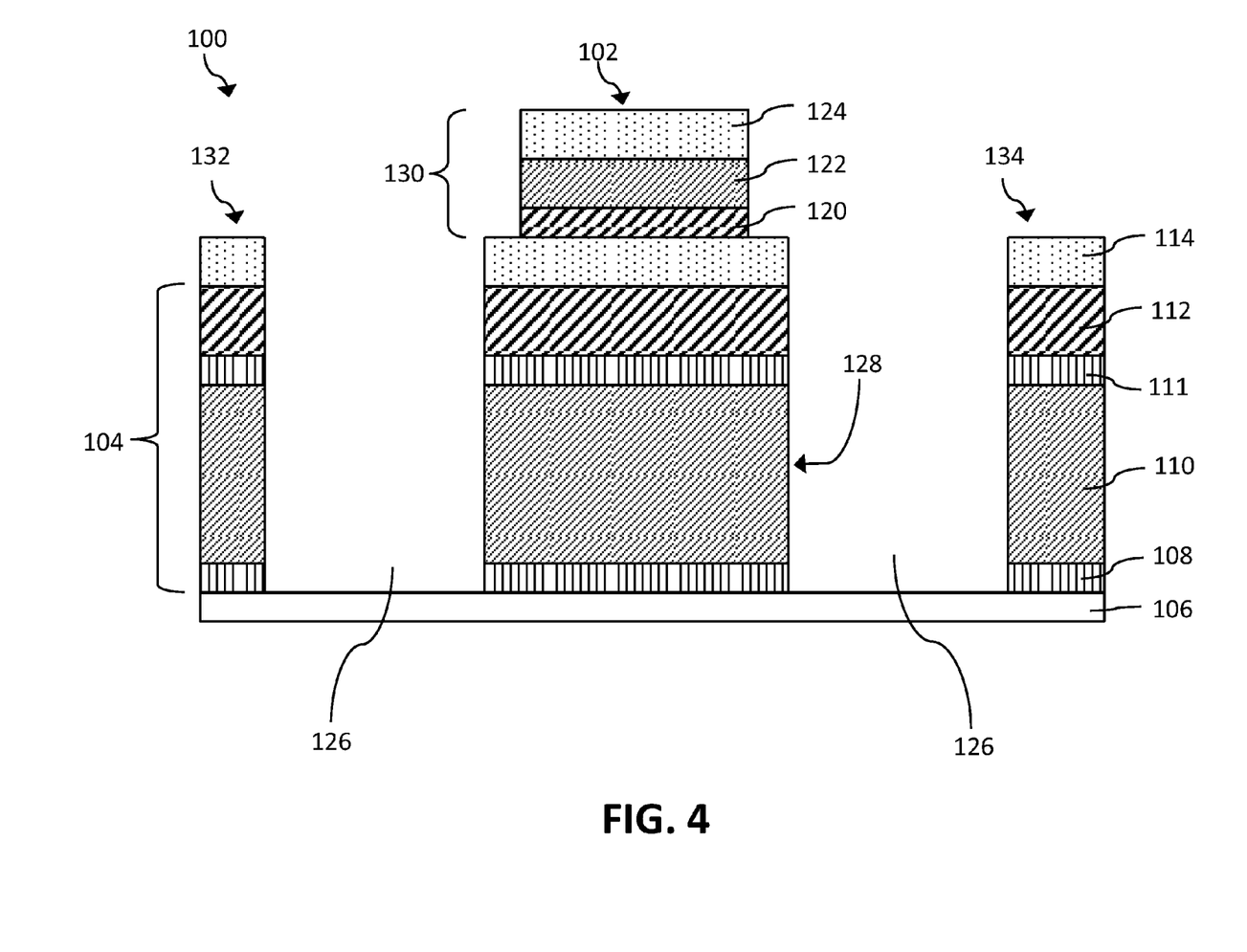
Figure 5:
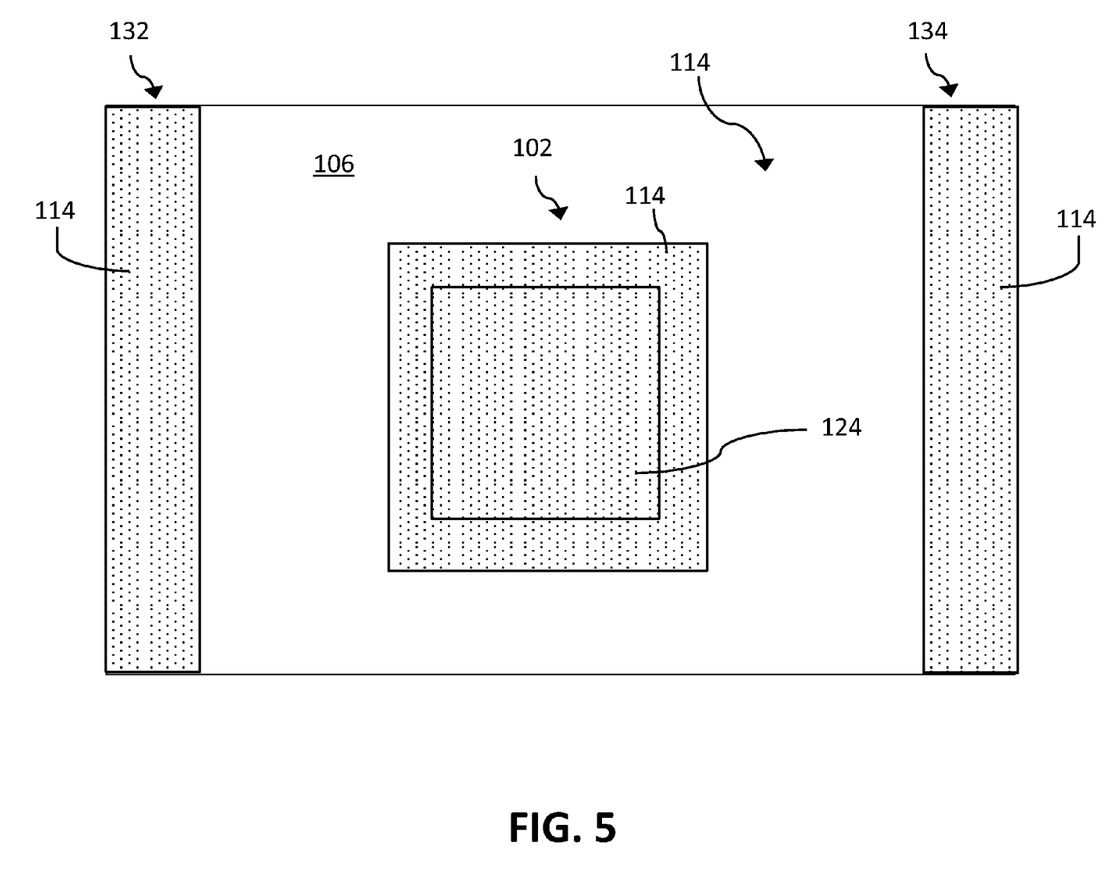

FIGS. 4 and 5 depicts an additional process according to various embodiments of the invention, the process including forming the top plate 130 of MIM capacitor 102 substantially adjacent metallurgy stack 104 of semiconductor structure 100. More specifically, as shown in FIGS. 4 and 5, top plate 130 of MIM capacitor 102 may be formed above first dielectric layer 114 positioned substantially above aluminum island 128 of semiconductor structure 100. Top plate 130 of MIM capacitor 102 may be formed in the portion of semiconductor structure 100 substantially surrounded and/or isolated by opening 126. As shown in FIG. 4, top plate 130 may be removing portions of second titanium nitride layer 120, second aluminum layer 122, and second dielectric layer 124 using any conventional material removal technique described herein and/or known in the art. That is, subsequent to the formation of opening 126 in semiconductor structure 100, the various layers used to form top plate 130 of MIM capacitor 102 (e.g., second titanium nitride layer 120, second aluminum layer 122, and second dielectric layer 124) may undergo a further conventional material removal process. As shown in FIGS. 4 and 5, a portion of second titanium nitride layer 120, second aluminum layer 122, and second dielectric layer 124 may be removed to expose a portion of first dielectric layer 114 positioned above aluminum island 128. As a result of the removal process, second titanium nitride layer 120, second aluminum layer 122, and second dielectric layer 124 forming top plate 130 of MIM capacitor 102 may be substantially concentric and/or positioned within the outer edges of first dielectric layer 114 positioned above aluminum island 128 of semiconductor structure 100.

FIGS. 4 and 5 depicts an additional process according to various embodiments of the invention, the process including forming interconnects 132, 134 within semiconductor structure 100. More specifically, as shown in FIGS. 4 and 5, interconnects 132, 134 may be formed within semiconductor structure 100 adjacent MIM capacitor 102. As shown in FIGS. 4 and 5, interconnects 132, 134 may be formed by removing the layers included in top plate 130 of MIM capacitor 102 (e.g., second titanium nitride layer 120, second aluminum layer 122, and second dielectric layer 124) not included in MIM capacitor and/or separated by opening 126. That is, the various layers used to form top plate 130 of MIM capacitor 102 that may be positioned outside of opening 126 may be completely removed from semiconductor structure 100 to expose first dielectric layer 114, and ultimately form interconnects 132, 134.

Figure 6:
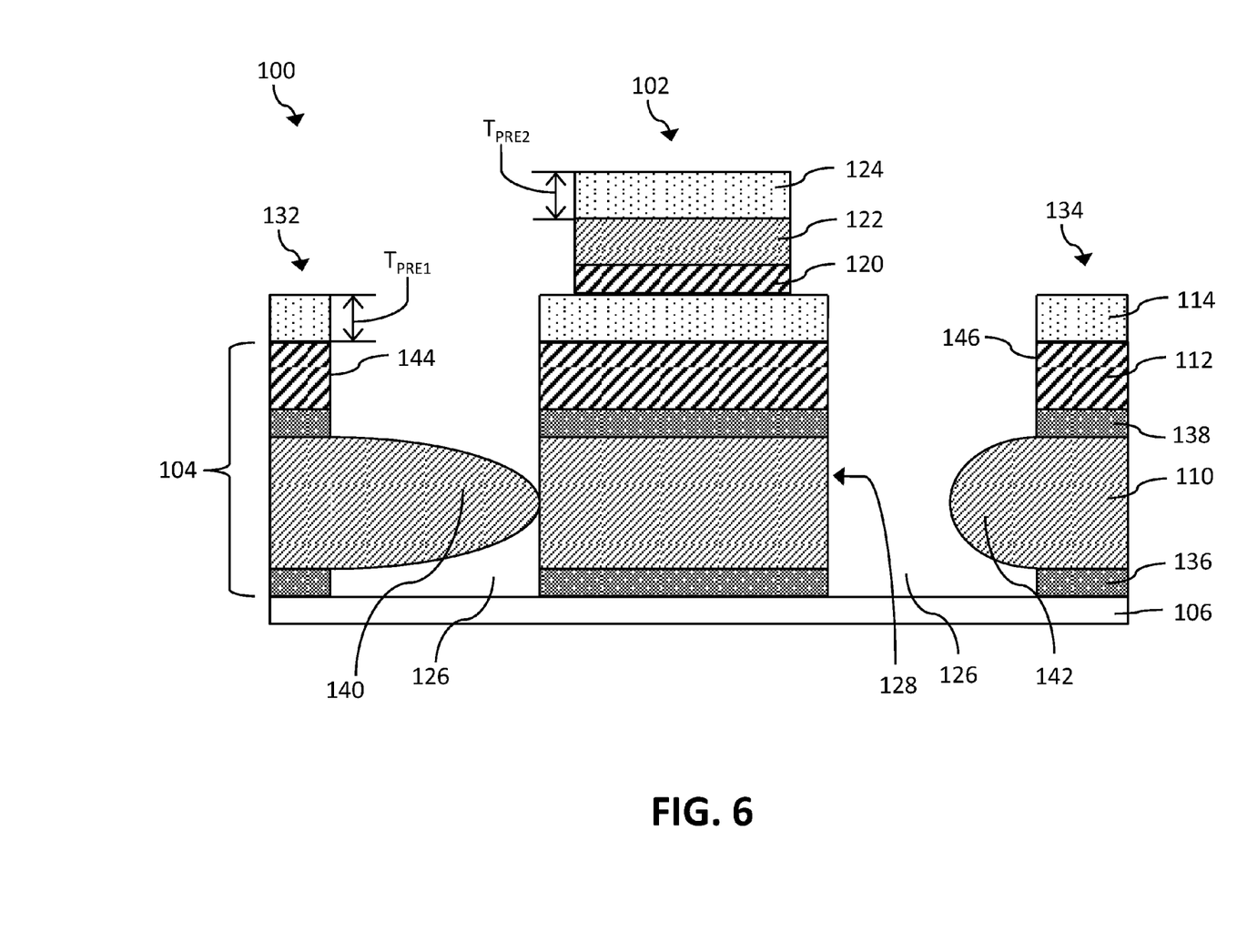

FIG. 6 depicts another process according to various embodiments of the invention, the process including performing a metal annealing process on semiconductor structure 100. As shown in FIG. 6, some of the layers of metallurgy stack 104 may be altered as a result of the metal annealing process. Specifically, as a result of semiconductor structure 100 undergoing a metal annealing process, first titanium layers 108 and second titanium layer 111 (FIG. 1) may be converted to a first titanium aluminide ($TiAl_3$) layer 136 and second titanium aluminide layer 138 positioned above and below first aluminum layer 110. Additionally, as shown in FIG. 6, and in comparison to FIG. 2, first aluminum layer 110 may be substantially compressed, resulting in a decrease in height of first aluminum layer 110. More specifically, first aluminum layer 110 may decrease in height after the metal annealing process as a result of first lateral extrusions 140, 142 forming in semiconductor structure 100. First lateral extrusions 140, 142 of first aluminum layer 110, as shown in FIG. 6, may be formed in first aluminum layer 110 as a result of the high temperature and/or compression force applied to semiconductor structure 100 during the metal annealing process.

As shown in FIG. 6, first lateral extrusions 140, 142 may extend into opening 126 formed in semiconductor structure 100. More specifically, as shown in FIG. 6, first lateral extrusion 140 formed from first aluminum layer 110 of interconnect 132 may extend laterally from sidewall 144 into opening 126, and substantially toward MIM capacitor 102. After the metal annealing process, first lateral extrusion 140 formed in interconnect 132 may contact aluminum island 128 of MIM capacitor 102. As shown in FIG. 6, where first lateral extrusion 140 contacts aluminum island 128 of MIM capacitor 102, an electrical connectivity issue may occur in semiconductor structure 100. More specifically, by extending from first aluminum layer 110 of interconnect 132 to aluminum island 128 of MIM capacitor 102, first lateral extrusion 140 may short a potential circuit formed in semiconductor structure 100.

Additionally, as shown in FIG. 6, first lateral extrusion 142 formed from first aluminum layer 110 of interconnect 134 may extend laterally from sidewall 146 into opening 126, and substantially toward MIM capacitor 102. First lateral extrusion 142 of interconnect 134 may not extend laterally to contact aluminum island 128 of MIM capacitor 102, and as a result, may not immediately result in any operational issues (e.g., shorted circuit) within semiconductor structure 100. However, subsequent processing, testing and/or utilization of semiconductor structure 100 including first lateral extrusion 142 may ultimately result in shorted circuits or electrical connections formed in semiconductor structure 100.

FIG. 6 depicts another process according to various embodiments of the invention, the process including determining a pre-removal thickness ($T_{PRE1}$) for first dielectric layer 114 and a pre-removal thickness ($T_{PRE2}$) for second dielectric layer 124. The pre-removal thicknesses ($T_{PRE1-2}$) are determined by the deposited thickness of first dielectric layer 114 and second dielectric layer 124, respectively. That is, the pre-removal thicknesses ($T_{PRE1-2}$) may be determined during or subsequent to the depositing or formation of first dielectric layer 114 and second dielectric layer 124, respectively. As discussed herein, pre-removal thicknesses ($T_{PRE1-2}$) may aid in determining if semiconductor structure 100 may include any operational issues (e.g., shorted circuit), and ultimately require further processing or repair before semiconductor structure 100 may be operational.

Figure 7:
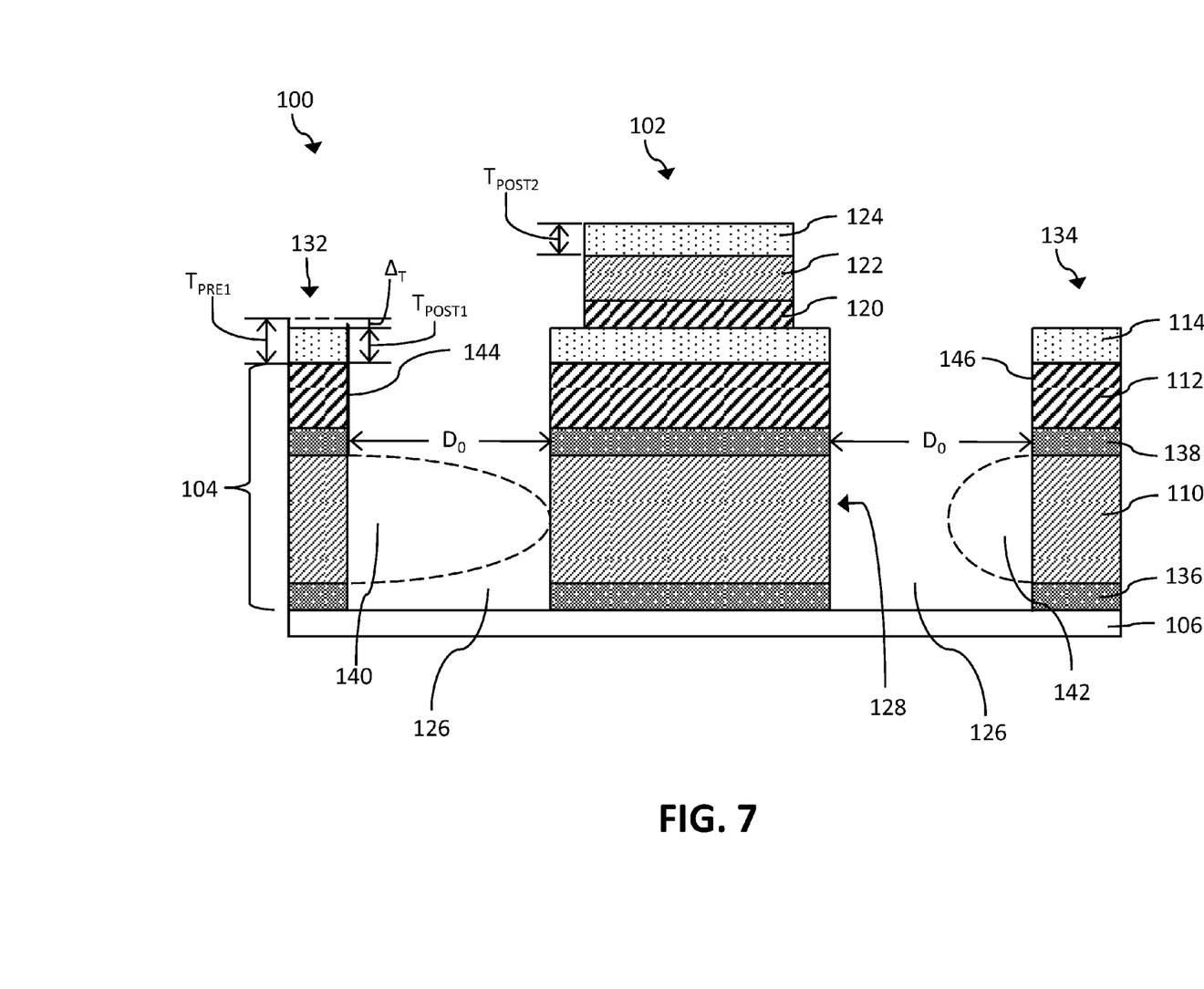

FIG. 7 depicts another process according to various embodiments of the invention, the process including removing first lateral extrusions 140, 142 in first aluminum layer 110 of semiconductor structure 100. More specifically, as shown in FIG. 7, first lateral extrusion 140, 142 formed in first aluminum layer 110 during the metal annealing process may be substantially removed from opening 126 of semiconductor structure 100. As shown in FIG. 7, after the removing process, lateral extrusions 140 of interconnect 132 may no longer contact aluminum island 128 of MIM capacitor 102. The removed portions of first lateral extrusions 140, 142 of first aluminum layer 110 may be removed by performing a dry etching process on the portion of first lateral extrusions 140, 142. More specifically, the material removal technique used to remove the portion of first lateral extrusions 140, 142 of first aluminum layer 110 may include any conventional dry etching or sputter etching process including, but not limited to: reactive-ion etching, ion-beam etching, etc.

As shown in FIG. 7, the distance ($D_o$) between interconnects 132, 134 and MIM capacitor 102 may be known and utilized in the removal process of first lateral extrusions 140, 142, as discussed herein. More specifically, during the formation of opening 126 in semiconductor structure 100, distance ($D_o$) between interconnects 132, 134 and MIM capacitor 102 may be predetermined, such that the predetermined distance ($D_o$) may aid in the removal process of first lateral extrusions 140, 142. That is, by knowing predetermined distance ($D_o$), the removal process of first lateral extrusions 140, 142 may be performed, such that a risk of undesirable removal of portions of interconnects 132, 134 (e.g., first titanium nitride layer 112) and/or MIM capacitor (e.g., aluminum island 128) may be substantially minimized and/or eliminated. As a result, first lateral extrusions 140, 142 may be removed to avoid electrical connectivity issue, and interconnects 132, 134 and/or MIM capacitor 102 may be substantially unaffected by the removal process of first lateral extrusions 140, 142, as discussed herein.

FIG. 7 depicts another process according to various embodiments of the invention, the process including determining a post-removal thickness ($T_{POST1}$) of first dielectric layer 114 and a post-removal thickness ($T_{POST2}$) of second dielectric layer 124, 122 subsequent to the removing of the portion of first lateral extrusions 140, 142. More specifically, a manufacturer may utilize a transmission electron microscopy (TEM) technique to determine the post-removal thickness ($T_{POST1}$) of first dielectric layer 114 positioned over titanium nitride layer 112 of metallurgy stack 104 and a post-removal thickness ($T_{POST2}$) of second dielectric layer 124 positioned over second aluminum layer 122 of MIM capacitor 102. As shown in FIG. 7, and with comparison to FIG. 6, the thickness of first dielectric layer 114 and second dielectric layer 124, respectively, may be substantially decreased subsequent to the removal process of a portion of first lateral extrusions 140, 142. That is, post-removal thickness ($T_{POST1}$) of first dielectric layer 114 may be smaller than pre-removal thickness ($T_{PRE1}$) for first dielectric layer 114 (FIG. 6) as a result of the removal process discussed herein. Additionally, the post-removal thickness ($T_{POST2}$) of second dielectric layer 124 may be smaller than pre-removal thickness ($T_{PRE2}$) for second dielectric layer 124 (FIG. 6) as a result of the removal process discussed herein. During the removal process of a portion of first lateral extrusions 140, 142 of first aluminum layer 110, a portion of first dielectric layer 114 and second dielectric layer 124 may also be removed. More specifically, when dry etching process is performed on semiconductor structure 100 to remove a portion of first lateral extrusions 140, 142, the dry etching process may also include removing an exposed portion of first dielectric layer 114 and second dielectric layer 124, resulting in a decreased thickness (e.g., post-removal thickness ($T_{POST1-2}$)) of first dielectric layer 114 and second dielectric layer 124, respectively.

FIG. 7 depicts an additional process according to various embodiments of the invention, the process including determining a difference ($\Delta_T$) between post-removal thickness ($T_{POST1-2}$) of first dielectric layer 114 and second dielectric layer 124, and pre-removal thickness ($T_{PRE1-2}$) for first dielectric layer 114 and second dielectric layer 124, respectively (FIG. 6). More specifically, a difference ($\Delta_T$) in the thickness of first dielectric layer 114 of metallurgy stack 104 and second dielectric layer 114 positioned over aluminum layer 122 of MIM capacitor 102 may be determined by comparing the post-removal thickness ($T_{POST1-2}$) with the pre-removal thickness ($T_{PRE1-2}$) for first dielectric layer 114 and second dielectric layer 124 (FIG. 6). As discussed herein, and as shown in FIG. 7, the post-removal thickness ($T_{POST1}$) of first dielectric layer 114 may be smaller than the pre-removal thickness ($T_{PRE1}$) for first dielectric layer 114 as a result of the removal process (e.g., dry etching process) performed on first lateral extrusions 140, 142. Also shown in FIG. 7, the post-removal thickness ($T_{POST2}$) of second dielectric layer 124 may be smaller than the pre-removal thickness ($T_{PRE2}$) for second dielectric layer 124 as a result of the removal process, as discussed herein. For example, first dielectric layer 114 positioned on interconnect 132 may include a post-removal thickness ($T_{POST1}$) smaller than the pre-removal thickness ($T_{PRE1}$) (shown in phantom). After determining both the post-removal thickness ($T_{POST1}$) and the pre-removal thickness ($T_{PRE1}$) for first dielectric layer 114, the difference ($\Delta_T$) in thickness in first dielectric layer 114 of interconnect 132 may be determined. As discussed herein, the difference ($\Delta_T$) in thickness in first dielectric layer 114 may determine if semiconductor structure 100 includes an electrical fault or operational issues (e.g., shorted circuit) created during the removal process of lateral extrusions 140, 142. Although only shown in determining the difference ($\Delta_T$) in thickness in first dielectric layer 114 of interconnect 132, it is understood that a difference ($\Delta_T$) in thickness will also occur in second dielectric layer 124 of MIM capacitor 102 as a result of the removal process. The difference ($\Delta_T$) in thickness in second dielectric layer 124 of MIM capacitor 102 may be determined using a substantially similar technique as discussed herein with respect to determining the difference ($\Delta_T$) in thickness in first dielectric layer 114 of interconnect 132.

A further process according to various embodiments of the invention may include determining if the difference ($\Delta_T$) between the post-removal thicknesses ($T_{POST1-2}$) and the pre-removal thicknesses ($T_{PRE1-2}$) of first dielectric layer 114 and second dielectric layer 124, respectively, exceeds a predetermined condition threshold. That is, subsequent to the determining of the difference ($\Delta_T$) between the post-removal thickness ($T_{POST1}$) and the pre-removal thickness ($T_{PRE1}$) of first dielectric layer 114, it may be determined if the difference ($\Delta_T$) in first dielectric layer 114 exceeds a predetermined condition threshold. The predetermined condition threshold may include a desirable post-removal thickness range for first dielectric layer 114, such that first dielectric layer 114 within the thickness range may provide a desired functionality (e.g., electrical insulator) for semiconductor structure 100. The predetermined condition threshold may also be based upon a variety of characteristics of semiconductor structure 100. More specifically, the predetermined condition threshold may be based upon the pre-removal thickness ($T_{PRE1}$) of first dielectric layer 114, the material composition of first dielectric layer 114, the electrical properties of the various layers (e.g., first aluminum layer 110, first dielectric layer 114) of semiconductor structure 100, subsequent manufacturing or testing processes performed on semiconductor structure 100 and/or the removal process (e.g., dry etching) performed on semiconductor structure 100.

Where the difference ($\Delta_T$) in first dielectric layer 114 does not exceed the predetermined condition threshold, it may be determined that semiconductor structure 100 may be substantially free from any operational issues (e.g., shorted circuit). More specifically, where the difference ($\Delta_T$) in first dielectric layer 114 does not exceed the predetermined condition threshold, a desirable amount of first dielectric material may be removed during the removal process, as discussed herein, and semiconductor structure 100 may not include any operational issues (e.g., shorted circuit) caused by first dielectric layer 114.

Conversely, where the difference ($\Delta_T$) in first dielectric layer 114 does exceed the predetermined condition threshold, it may be determined that semiconductor structure 100 may include operational issues (e.g., shorted circuit). More specifically, when the difference ($\Delta_T$) in first dielectric layer 114 exceeds the predetermined condition threshold, it may be determined that an undesirable and/or excessive amount of first dielectric layer 114 was removed during the removal process, as discussed herein. As a result, it may also be determined that first dielectric layer 114 may not provide adequate insulation for the surrounding layers (e.g., first titanium nitride layer 112) included in metallurgy stack 104. The inadequate functionality (e.g., electrical insulation) of first dielectric layer 114, caused by the undesirable and/or excessive amount removed from first dielectric layer 114 during the removal process, may ultimately result in operational issues (e.g., shorted circuit) in semiconductor structure 100.

An additional process according to various embodiments of the invention may include providing an indicator of an electrical fault (e.g., electrical short) in semiconductor structure 100 in response to the determined difference ($\Delta_T$) between the post-removal thickness ($T_{POST1}$) and the pre-removal thickness ($T_{PRE1}$) of first dielectric layer 114 exceeding a predetermined condition threshold. That is as discussed herein, where the difference ($\Delta_T$) between the post-removal thickness ($T_{POST1}$) and the pre-removal thickness ($T_{PRE1}$) of first dielectric layer 114 exceeds a predetermined condition threshold, semiconductor structure 100 may include operational issues (e.g., shorted circuit). As such, a manufacturer of semiconductor structure 100 may be provided with an indicator that the difference ($\Delta_T$) exceeds the predetermined condition threshold, which may also indicate that semiconductor structure 100 includes operational issues (e.g., shorted circuit). As a result, the manufacturer of semiconductor structure 100 may further examine, test, and/or perform additionally processes on semiconductor structure 100 to substantially repair and/or prevent operational issues (e.g., shorted circuit) within semiconductor structure 100. For example, where it is determined that the difference ($\Delta_T$) exceeds a predetermined condition threshold, a manufacturer may deposit additional material over first dielectric layer 114, to ensure first dielectric layer 114 may properly insulate metallurgy stack 104 of semiconductor structure 100. The indicator of electrical fault (e.g., electrical short) in semiconductor structure 100 may be provided to a manufacturer using any conventional system. For example, a computing system in communication with the TEM used to examine first dielectric layer 114 of semiconductor structure 100 may determine the difference ($\Delta_T$) exceeds a predetermined condition threshold. Subsequently, a conventional interface of the computing system may provide a manufacturer with an indicator using any conventional interface including: a graphical user interface (GUI), an auditory indicator (e.g., siren), a visual indicator (e.g., light, print out), or other conventional indicator known in the art.

It is understood that the difference ($Å_T$) between the post-removal thickness ($T_{POST2}$) and the pre-removal thickness ($T_{PRE2}$) of second dielectric layer 124 functions and/or performs substantially similar to the difference ($\Delta_T$) in thickness for first dielectric layer 114, as discussed herein. As a result of the common functionality, further explanation is omitted for clarity.

As shown in FIG. 7, difference ($\Delta_T$) between the post-removal thickness ($T_{POST1}$) and the pre-removal thickness ($T_{PRE1}$) of first dielectric 114 may not exceed the predetermined condition threshold. Additionally, the difference ($\Delta_T$) between the post-removal thickness ($T_{POST2}$) and the pre-removal thickness ($T_{PRE2}$) of second dielectric 114 may not exceed the predetermined condition threshold also. As a result, semiconductor structure 100, may be substantially free of any operational issues (e.g., circuit shorts) and may provide desirable functionality during utilization. As shown in FIG. 7, semiconductor structure 100 may include metallurgy stack 104 including first aluminum layer 110. First aluminum layer 110 may include etched portions of first lateral extrusions 140, 142. As discussed herein, etched portions of first lateral extrusions 140, 142 may be formed during a removal process performed on semiconductor structure 100. Semiconductor structure 100, as shown in FIG. 7, may also include first dielectric layer 114 formed in interconnects 132, 134, and second dielectric layer 124 formed in MIM capacitor 102 positioned adjacent metallurgy stack 104. Opening 126 extending through metallurgy stack 104 may substantially surround MIM capacitor 102, as shown in FIG. 7, and discussed herein.

Figure 8:
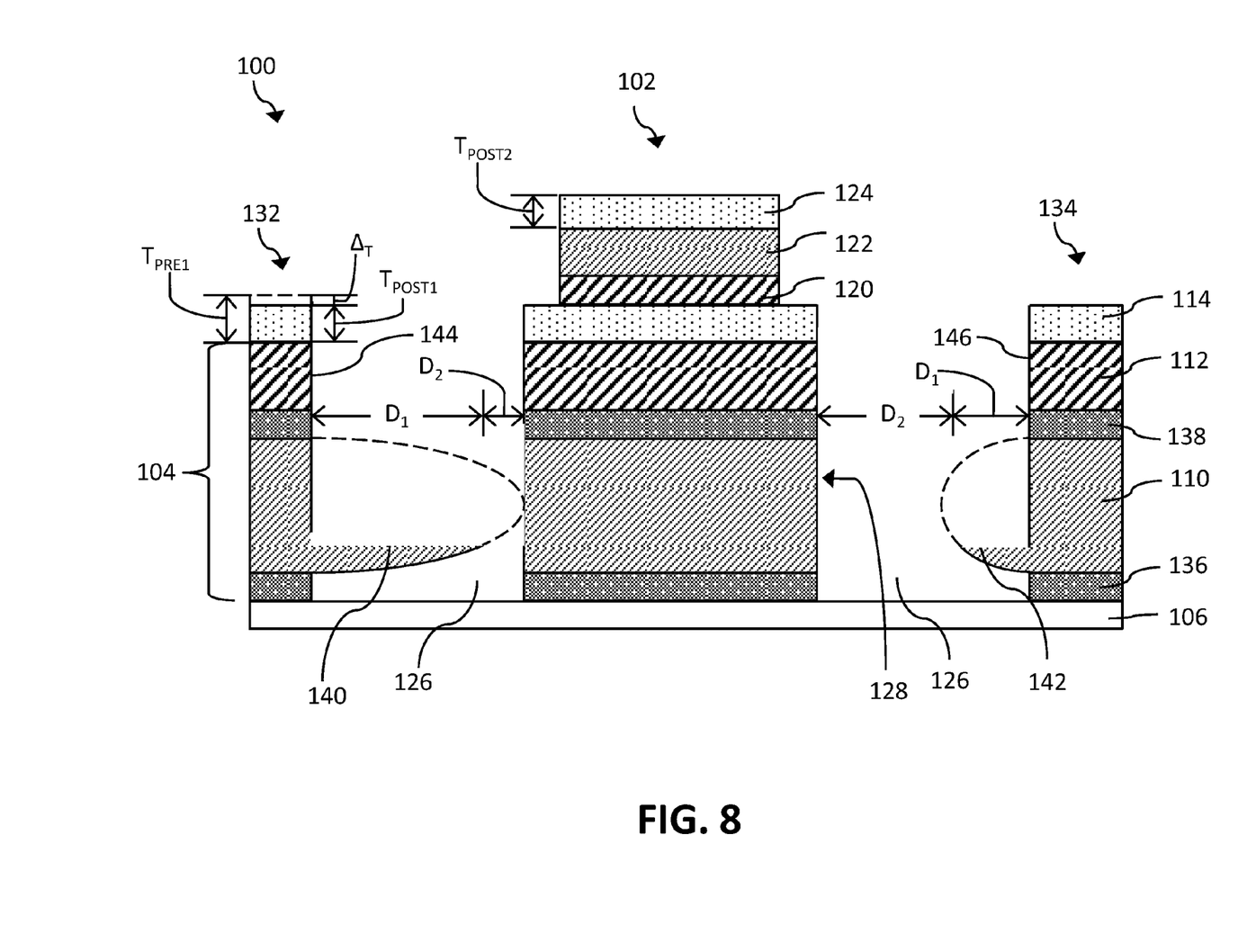
FIG. 8 shows a cross-sectional front view of a semiconductor structure undergoing processes according to various alternative embodiments of the invention

In an alternative embodiment, as shown in FIG. 8, the removing of the first lateral extrusions 140, 142 may include removing only a portion of first lateral extrusions 140, 142. More specifically, and in comparison to FIG. 7, in FIG. 8, a directional etch may be performed on first lateral extrusions 14, 142 such that only a predetermined portion of first lateral extrusions 140, 142 may be removed from opening 126. As shown in FIG. 8 the removing of the first lateral extrusions 140, 142 may include removing the portions of first lateral extrusions 140, 142 a first predetermined distance ($D_1$) from interconnects 132, 134 formed in metallurgy stack 104. More specifically, as shown in FIG. 8, the removed portion of first lateral extrusion 140 formed in interconnect 132 of metallurgy stack 104 may be removed to a first predetermined distance ($D_1$) from sidewall 144 of interconnect 132/metallurgy stack 104. The portion of first lateral extrusion 140 may be removed a first predetermined distance ($D_1$) from sidewall 144 of metallurgy stack 104 forming interconnect 132, such that first lateral extrusion 140 may not be flush with sidewall 144 and may only partially and/or include a portion that extends into opening 126. By removing the portion of first lateral extrusion 140 of interconnect 132 a first predetermined distance ($D_1$) from sidewall 144 of metallurgy stack 104 forming interconnect 132, a manufacturer of semiconductor structure 100 may prevent damage (e.g., etching sidewall 144 of metallurgy stack 104) to semiconductor structure 100 during the removal process. Additionally, the removal of a portion of first lateral extrusion 140 of interconnect 132 may substantially repair and/or prevent operational issues (e.g., shorted circuit) within semiconductor structure 100 that may be created by the metal annealing process.

During the removal process, the dry etching of first lateral extrusion 140 a first predetermined distance ($D_1$) from sidewall 144 of metallurgy stack 104 forming interconnect 132 may be achieved by determining the distance ($D_o$) of opening 126, as discussed herein with respect to FIG. 7. As such, during the removal process, the system (e.g., computing device) configured to perform the dry etching process may determine the distance ($D_o$) of opening 126 and subsequently may determine how much of first lateral extrusion 140 may be etched from opening 126. Determining the distance ($D_o$) of opening 126 may ensure sidewall 144 of interconnect 132 may not be etched during the removal process of first lateral extrusion 140.

As similarly discussed with respect to first lateral extrusion 140, first lateral extrusion 142 formed from first aluminum layer 110 in interconnect 134 may also have a portion removed a first predetermined distance ($D_1$) from metallurgy stack 104. More specifically, first lateral extrusion 142 formed in interconnect 134 may include a removed portion positioned a first predetermined distance ($D_1$) from sidewall 146 of metallurgy stack 104 forming interconnect 134. The portion of first lateral extrusion 142 may be removed a first predetermined distance ($D_1$) from sidewall 146 of metallurgy stack 104, such that first lateral extrusion 142 may not be flush with sidewall 146 and may only partially extend into opening 126. By removing the portion of first lateral extrusion 142 of interconnect 134 a first predetermined distance ($D_1$) from sidewall 146 of metallurgy stack 104 forming interconnect 134, a manufacturer of semiconductor structure 100 may prevent damage (e.g., etching sidewall 146 of metallurgy stack 104) to semiconductor structure 100 during the removal process. Additionally, the removal of a portion of first lateral extrusion 142 of interconnect 134 may substantially repair and/or prevent operational issues (e.g., shorted circuit) within semiconductor structure 100.

Also shown in FIG. 8, first lateral extrusions 140, 142 may be formed a second predetermined distance ($D_2$) from MIM capacitor 102 of semiconductor structure 100. More specifically, as shown in FIG. 8, during the removal process, a portion of first lateral extrusions 140, 142 may be removed a second predetermined distance ($D_2$) from MIM capacitor 102, to substantially prevent operational issues (e.g., shorted circuit) within semiconductor structure 100. By removing a portion of first lateral extrusions 140, 142 and positioning first lateral extrusions 140, 142 a second predetermined distance ($D_2$) from MIM capacitor 102, first lateral extrusions 140, 142 may not undesirably contact MIM capacitor 102 during further processing and/or during operation. As a result, first lateral extrusions 140, 142 may not cause, or threaten to cause, operational issues (e.g., shorted circuit) within semiconductor structure 100. The portion removed from first lateral extrusions 140, 142 a second predetermined distance ($D_2$) from MIM capacitor 102 may be removed during the removal process discussed herein. That is, the portion of first lateral extrusion 140, 142 may be removed a first predetermined distance ($D_1$) from metallurgy stack 104 forming interconnects 132, 134, respectively, and a second predetermined distance ($D_2$) from MIM capacitor 102, during a single removal process (e.g., dry etching process).

Predetermined distances ($D_{1-2}$) may be dependent upon a variety of characteristics of semiconductor structure 100 and/or the processes performed on semiconductor structure 100. For example, the characteristics from which predetermined distances ($D_{1-2}$) depends include, but are not limited to: the material (e.g., first aluminum layer 110, first titanium layer 108) used in forming semiconductor structure 100, thickness of metallurgy stack 104, thickness of the various layers (e.g., first aluminum layer 110, first titanium layer 108) of semiconductor structure 100, size of MIM capacitor 102 formed in semiconductor structure 100, intended use of MIM capacitor 102, the characteristics (e.g., temperature, time) of metal annealing process performed on semiconductor structure 100, the dry etching process performed on semiconductor structure 100, electrical characteristics of semiconductor structure 100, the size of first lateral extrusions 140, 142, etc. Additionally, although the predetermined distances ($D_{1-2}$) for first lateral extrusions 140, 142 may be shown as substantially unequal in FIG. 8, it is understood that the predetermined distances ($D_{1-2}$) may be equal for each of the first lateral extrusions 140, 142. That is, the predetermined distances ($D_{1-2}$) for first lateral extrusion 140 may differ from, or be equal to, the predetermined distance ($D_{1-2}$) for first lateral extrusion 142.

Figure 9:
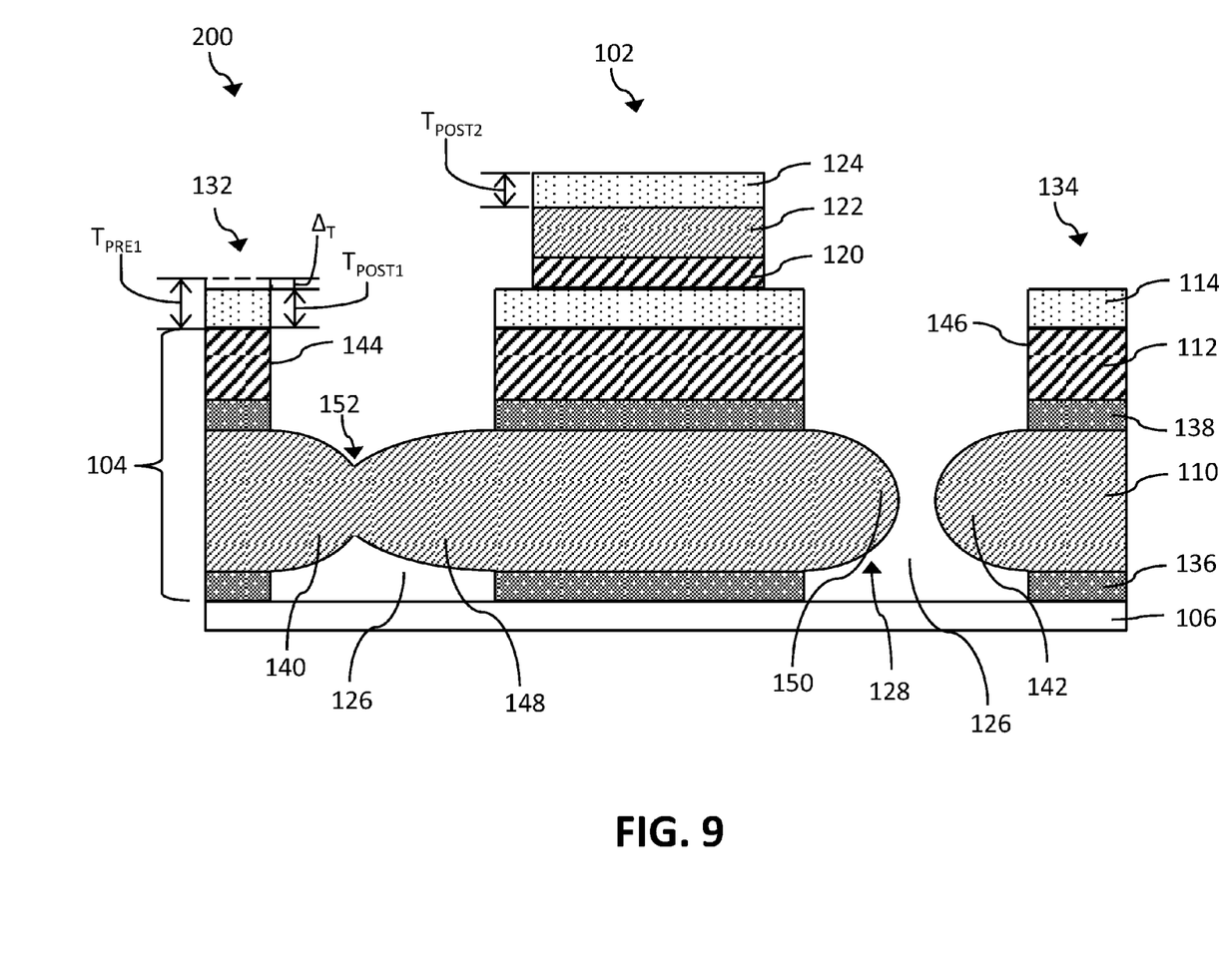
FIGS. 9 and 10 show a cross-sectional front view of a semiconductor structure undergoing processes according to various additional embodiments of the invention.
Figure 10:
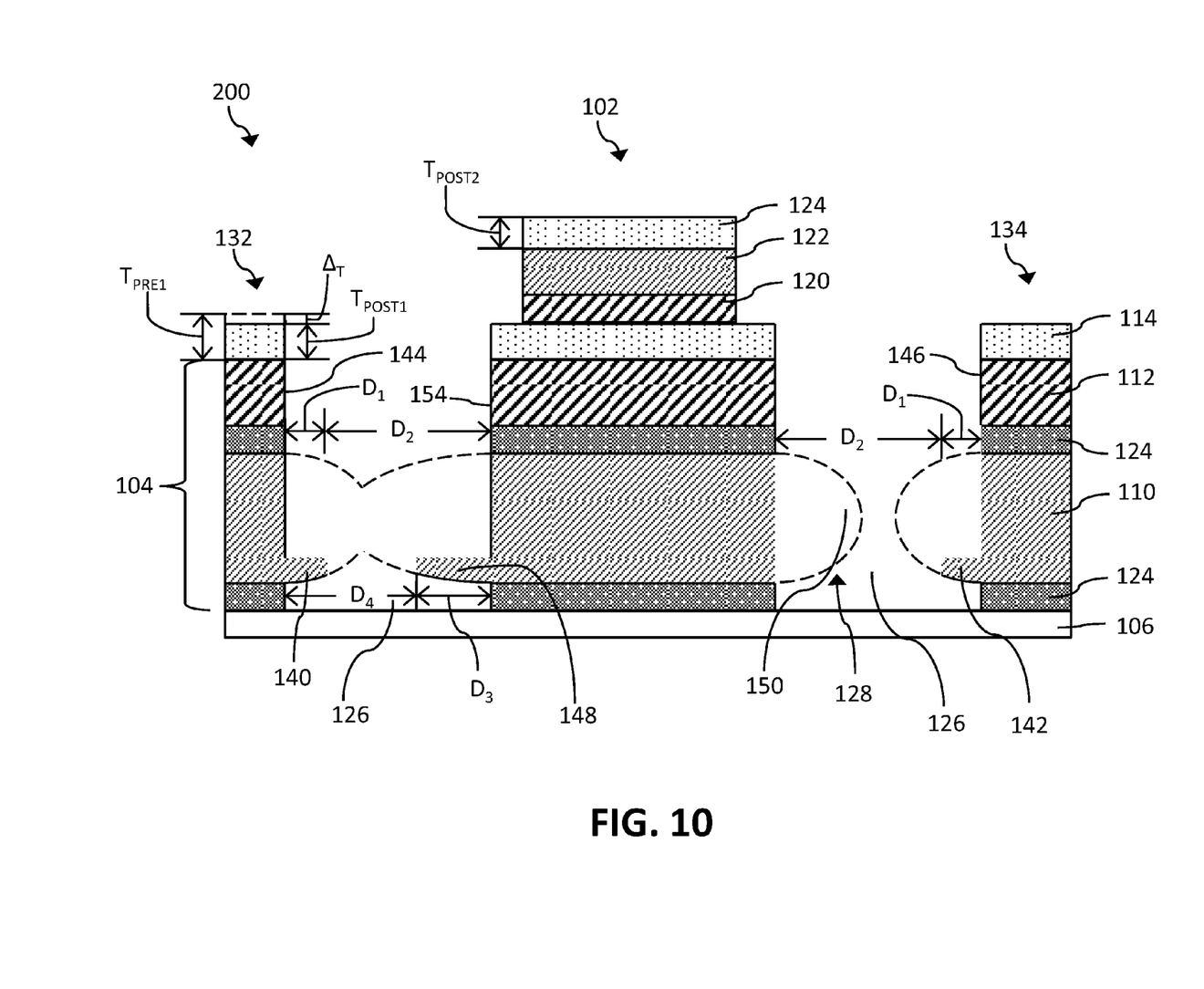

Additional embodiments of a method of forming semiconductor structure 200 may now be described with reference to FIGS. 9 and 10. Turning to FIGS. 9 and 10, an additional illustrative embodiment according to various embodiments is shown.

FIGS. 9 and 10 depict processes according to various embodiments of the invention, those processes being substantially similar to the processes described with reference to FIGS. 6-8. Specifically, FIG. 9 shows a cross-section front view of a portion of semiconductor structure 200 according to alternative embodiments of the invention, similar to semiconductor structure 100 shown in FIG. 6. In the Figures, it is understood that similarly numbered components may represent substantially similar components, which can function in a substantially similar manner. Redundant explanation of these components has been omitted for clarity.

Semiconductor structure 200, as shown in FIG. 9, may have undergone a metal annealing process, as similarly discussed herein with respect to FIG. 6. In comparing FIGS. 6 and 9, it may be shown that semiconductor structure 200 may also include second lateral extrusions 148, 150 extending into opening 126. More specifically, as shown in FIG. 9, semiconductor structure 200 may include second lateral extrusions 148, 150 formed from aluminum island 128 of MIM capacitor 102. Second lateral extrusions 148, 150 may substantially extend into opening 126, and may extend laterally toward first lateral extrusions 140, 142, respectively. As shown in FIG. 9, second lateral extrusion 148 of MIM capacitor 102 may extend toward first lateral extrusion 140 of metallurgy stack 104 and more specifically, second lateral extrusion 148 may contact first lateral extrusion 140 to form an aluminum bridge 152 between the respective lateral extrusions in semiconductor structure 200. However, second lateral extrusions 148, 150 may not always contact first lateral extrusions 140, 142 as a result of the metal annealing process performed on semiconductor structure 200. That is, as shown in FIG. 9, second lateral extrusion 150 of MIM capacitor 102 may extend toward first lateral extrusion 142 of metallurgy stack 104, but may be separate from first lateral extrusion 142.

FIG. 10 depicts an additional process according to various embodiments of the invention, the process including removing a portion of second lateral extrusions 148, 150 of aluminum island 128 of MIM capacitor 102. That is, as similarly discussed with reference to FIGS. 7 and 8 and the removal of first lateral extrusions 140, 142 in first aluminum layer 110, a portion of second lateral extrusions 148, 150 may be removed from opening 126 of semiconductor structure 100. The portions of second lateral extrusions 148, 150 may be removed by performing a dry etching process, as discussed herein. Similar to the removal of a portion of first lateral extrusions 140, 142, the removal of a portion of second lateral extrusions 148, 150 may substantially prevent operational issues (e.g., shorted circuit) within semiconductor structure 100.

It is understood that the portions of second lateral extrusions 148, 150 may be removed from opening 126 of semiconductor structure 100 preceding, simultaneous to, or subsequent to the removal of the portion of first lateral extrusions 140, 142 of semiconductor structure 100. That is, when a dry etching process is performed on semiconductor structure 100, the process may include removing both first lateral extrusions 140, 142 and second lateral extrusions 148, 150 during a single removal process, or removing each lateral extrusion (e.g., lateral extrusions 140, 142, 148, 150) individually.

As shown in FIG. 10, the removing of the portion of second lateral extrusions 148, 150 may include removing the portion a third predetermined distance ($D_3$) from MIM capacitor 102 of semiconductor structure 102. That is, second lateral extrusion 148 formed from aluminum island 128 of MIM capacitor 102 may be removed a third predetermined distance ($D_3$) from sidewall 154 of MIM capacitor 102. The portion of second lateral extrusion 148 may be removed a third predetermined distance ($D_3$) from respective sidewall 154 of MIM capacitor 102, such that second lateral extrusion 148 may not be flush with sidewall 154 and may only partially extend into opening 126. As shown in FIG. 10, second lateral extrusion 150 may be completely removed from opening 126, as similarly discussed with reference to FIG. 7.

Also shown in FIG. 10, and as similarly discussed herein, second lateral extrusions 148, 150 may be formed a fourth predetermined distance ($D_4$) from metallurgy stack 104 of semiconductor structure 100. More specifically, as shown in FIG. 10, a portion of second lateral extrusion 148 may be removed a fourth predetermined distance ($D_4$) from sidewall 144 of interconnect 132 of metallurgy stack 104. As discussed herein, the removal of a portion of second lateral extrusions 148, 150 may substantially prevent operational issues (e.g., shorted circuit) within semiconductor structure 200.

As similarly discussed herein with respect to predetermined distances ($D_{1-2}$), predetermined distances ($D_{3-4}$) may be dependent upon a variety of characteristics of semiconductor structure 200 and/or the processes performed on semiconductor structure 200. Redundant explanation of these characteristics is omitted for clarity. Additionally, although some of the predetermined distances ($D_{1-4}$) for first lateral extrusions 140, 142 and second lateral extrusions 148, 150 may be shown as substantially unequal in FIG. 10 (e.g., $D_1 \neq D_3$, $D_2 \neq D_4$), it is understood that the predetermined distances ($D_{1-4}$) may be equal for each of the first lateral extrusions 140, 142 and second lateral extrusions 148, 150.

It is understood that the additional process discussed herein (e.g., determining the difference ($\Delta_T$), providing an indicator, etc.) with respect to semiconductor structure 100 (FIGS. 6-8), may also be performed on semiconductor structure 200. These processes may be performed on or relating to semiconductor structure 200 in a substantially similar fashion as discussed herein. Redundant explanation of these processes has been omitted for clarity.

As shown in FIG. 10, semiconductor structure 200 may include metallurgy stack 104 including first aluminum layer 110. First aluminum layer 110 may include etched portions of first lateral extrusions 140, 142. As discussed herein, etched portions of first lateral extrusions 140, 142 may be formed during a removal process performed on semiconductor structure 200. Semiconductor structure 100, as shown in FIG. 10, may also include first dielectric layer 114 formed over metallurgy stack 104 forming interconnects 132, 134, and may include second dielectric layer 124 formed over MIM capacitor 102 positioned adjacent metallurgy stack 104. MIM capacitor 102 may include etched portions of second lateral extrusions 148, 150. As discussed herein, etched portions of second lateral extrusions 148, 150 may be formed during a removal process performed on semiconductor structure 200. Opening 126 extending through metallurgy stack 104 may substantially surround MIM capacitor 102, as shown in FIG. 10, and discussed herein.

Although discussed herein as metallurgy stack 104 being used to form MIM capacitor 102 (FIG. 4), it is understood that semiconductor structure 100 may include a variety of integrated circuit devices that may utilize opening 126 to substantially prevent first lateral extrusions 140, 142 (e.g., FIGS. 6-8) during a metal annealing process. More specifically, it is understood that semiconductor structure 100 may be any integrated circuit device that may include a variety of material making up the layers (e.g., first aluminum layer 110, first titanium layer 108) of semiconductor structure 100, that may undergo a metal annealing process, and as a result my include first lateral extrusions 140, 142. As such, the processes of removing a portion of first lateral extrusions 140, 142 of first aluminum layer 110 are not limited to metallurgy stack 104 forming MIM capacitor 102. Rather, the processes discussed herein may be included in any metal layer of an integrated circuit device that may include first lateral extrusions 140, 142 (FIGS. 6-8) formed during a metal annealing process of the integrated circuit device.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method comprising:
    removing a portion of a first lateral extrusion in an aluminum layer of a semiconductor structure;
    determining a post-removal thickness of a dielectric layer positioned adjacent the aluminum layer subsequent to the removing of the portion of the first lateral extrusion; and
    determining a difference between the post-removal thickness of the dielectric layer and a pre-removal thickness of the dielectric layer.

2. The method of claim 1, wherein the removing of the portion of the first lateral extrusion includes performing a dry etching process on the portion of the first lateral extrusion.

3. The method of claim 2, wherein the dry etching process includes a reactive-ion etching.

4. The method of claim 1, wherein the semiconductor structure further includes:
    a metallurgy stack including the first lateral extrusion in the aluminum layer;
    a metal-insulator-metal capacitor (MIM capacitor) structure positioned adjacent the metallurgy stack; and
    an opening extending through the metallurgy stack, the opening surrounding the MIM capacitor structure.

5. The method of claim 4, wherein the removing of the portion of the first lateral extrusion includes removing the portion of the first lateral extrusion a first predetermined distance from the metallurgy stack of the semiconductor structure.

6. The method of claim 4, wherein the first lateral extrusion in the aluminum layer extends into the opening.

7. The method of claim 5, wherein the removing of the portion of the first lateral extrusion includes removing the portion of the first lateral extrusion a second predetermined distance from the MIM capacitor structure of the semiconductor structure.

8. The method of claim 4, wherein the MIM capacitor structure includes a second lateral extrusion extending into the opening.

9. The method of claim 7, further comprising removing a portion of the second lateral extrusion a third predetermined distance from the MIM capacitor structure of the semiconductor structure.

10. The method of claim 9, wherein the removing of the portion of the second lateral extrusion includes removing the portion of the second lateral extrusion a fourth predetermined distance from the metallurgy stack of the semiconductor structure.

11. The method of claim 1, further comprising providing an indicator of an electrical fault in the semiconductor structure in response to the determined difference between the post-removal thickness and the pre-removal thickness of the dielectric layer exceeding a predetermined condition threshold.

12. The method of claim 11, wherein the predetermined condition threshold is based upon at least one of the pre-removal thickness of the dielectric layer, and a material composition of the dielectric layer of the semiconductor structure.

* * * * *